United States Patent [19]

Mizukoshi et al.

[11] 4,136,355
[45] Jan. 23, 1979

[54] DARLINGTON TRANSISTOR

[75] Inventors: Kanji Mizukoshi, Takatsuski; Goryo Hagio, Kusatsu, both of Japan

[73] Assignee: Matsushita Electronics Corporation, Kadoma, Japan

[21] Appl. No.: 765,426

[22] Filed: Feb. 3, 1977

[30] Foreign Application Priority Data

Feb. 10, 1976 [JP] Japan ................................. 51-13451
Aug. 11, 1976 [JP] Japan ................................. 51-96527
Nov. 2, 1976 [JP] Japan ................................. 51-131931

[51] Int. Cl.² .......................................... H01L 27/02
[52] U.S. Cl. ....................................... 357/46; 357/51
[58] Field of Search ........................... 357/46, 40, 51; 307/315

[56] References Cited

U.S. PATENT DOCUMENTS

| | | | |
|---|---|---|---|
| 3,510,735 | 5/1970 | Potter | 357/51 |
| 3,693,057 | 9/1972 | Wiedmann | 357/46 X |
| 3,836,997 | 9/1974 | Einthouen et al. | 357/46 |
| 3,913,213 | 10/1975 | Mills et al. | 357/46 X |

*Primary Examiner*—Stanley D. Miller, Jr.
*Assistant Examiner*—James W. Davie
*Attorney, Agent, or Firm*—Cushman, Darby & Cushman

[57] ABSTRACT

In a device of Darlington connection of transistors formed on one monolithic substrate, wherein the substrate has a collector region of a first conductivity and a base region of a second conductivity, the collector region and the base region forming a P-N junction inbetween, the base region has at least two emitter regions which are simultaneously formed therein with a specified space inbetween and have the conductivity type same with each other and opposite to that of said base region, the improvement is that the device comprising in said space another region having the same conductivity with that of said emitter regions and the depth larger than those of said emitter regions, thereby defining a narrow path between the collector-base P-N junction and a P-N junction formed between said another region and the base region. The narrow path functions are a bias resistor R1 of sufficiently high resistance connected between the bases of both tansistors, so as to give the device a satisfactory characteristic for the Darlington circuit.

5 Claims, 18 Drawing Figures

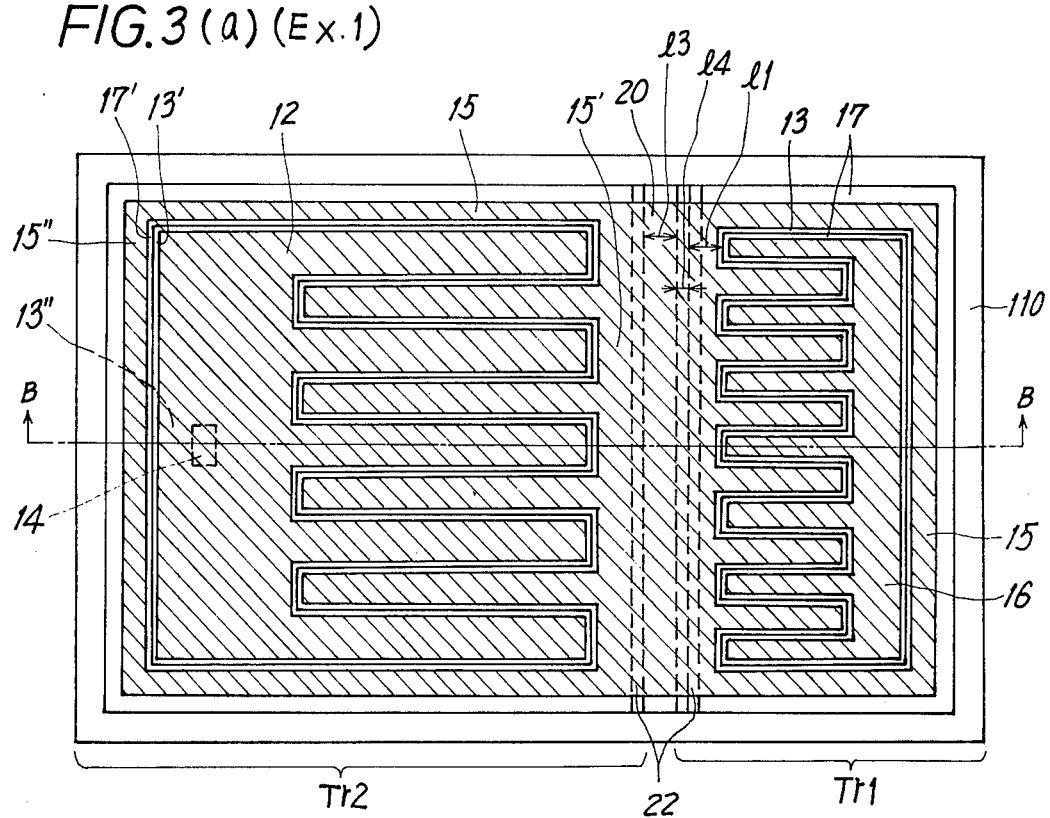
FIG.3(a) (Ex.1)
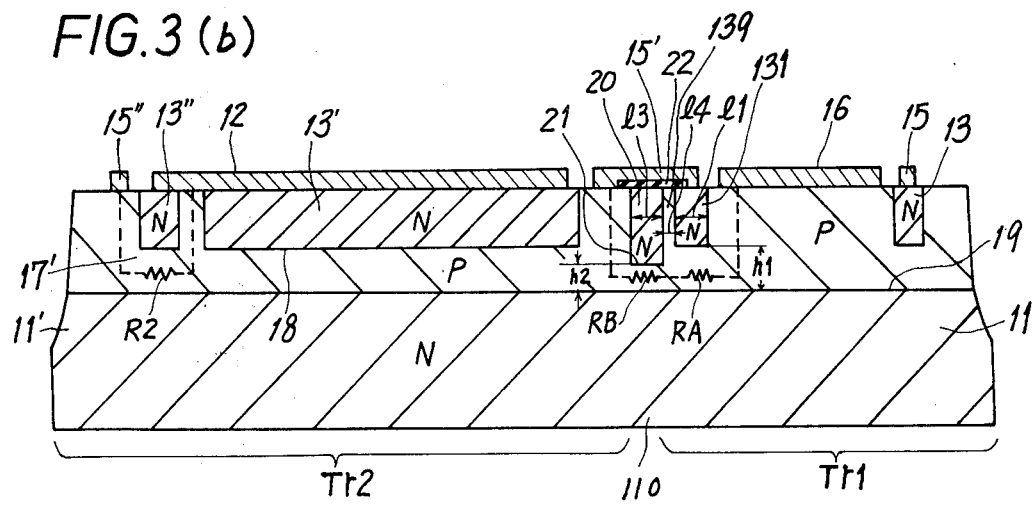
FIG.3(b)

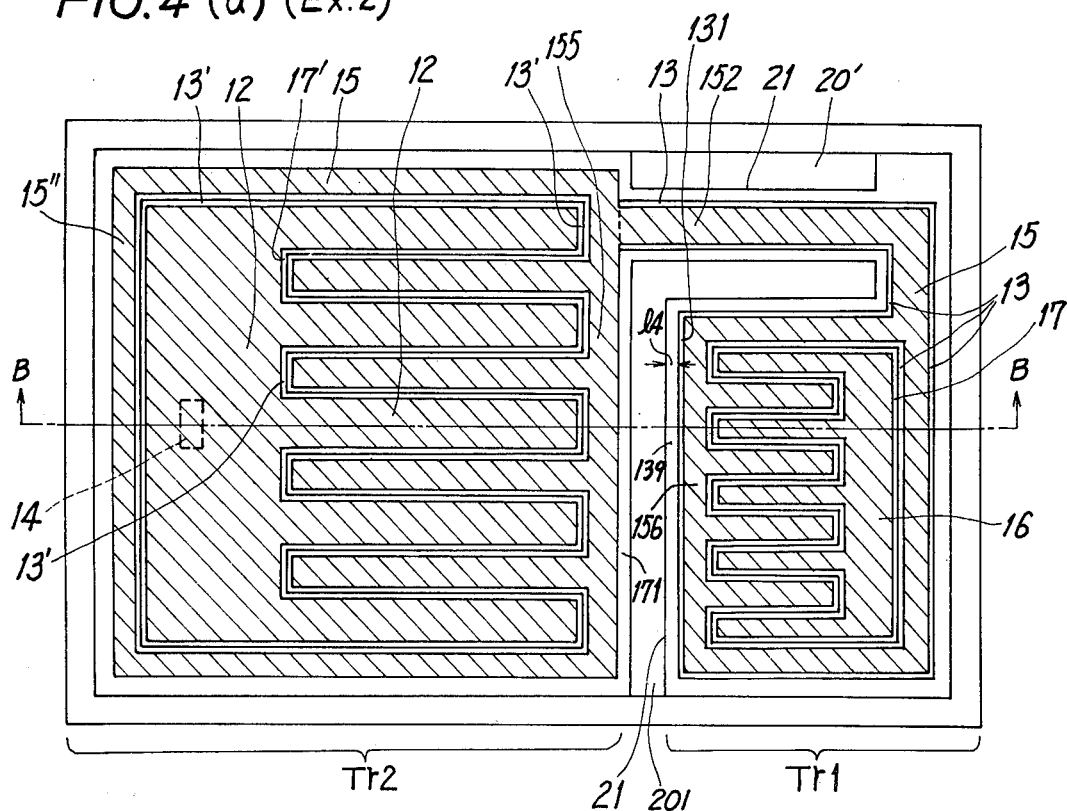
FIG. 4 (a) (Ex.2)
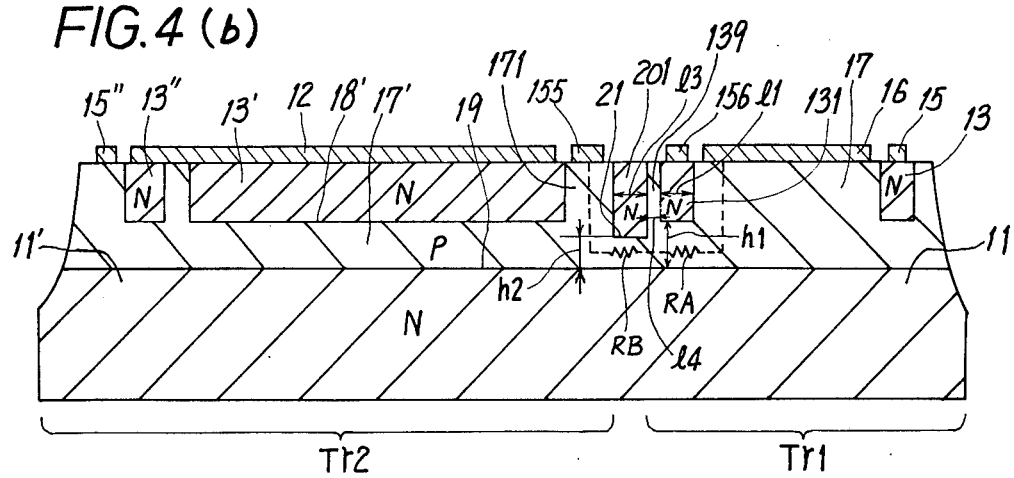
FIG. 4 (b)

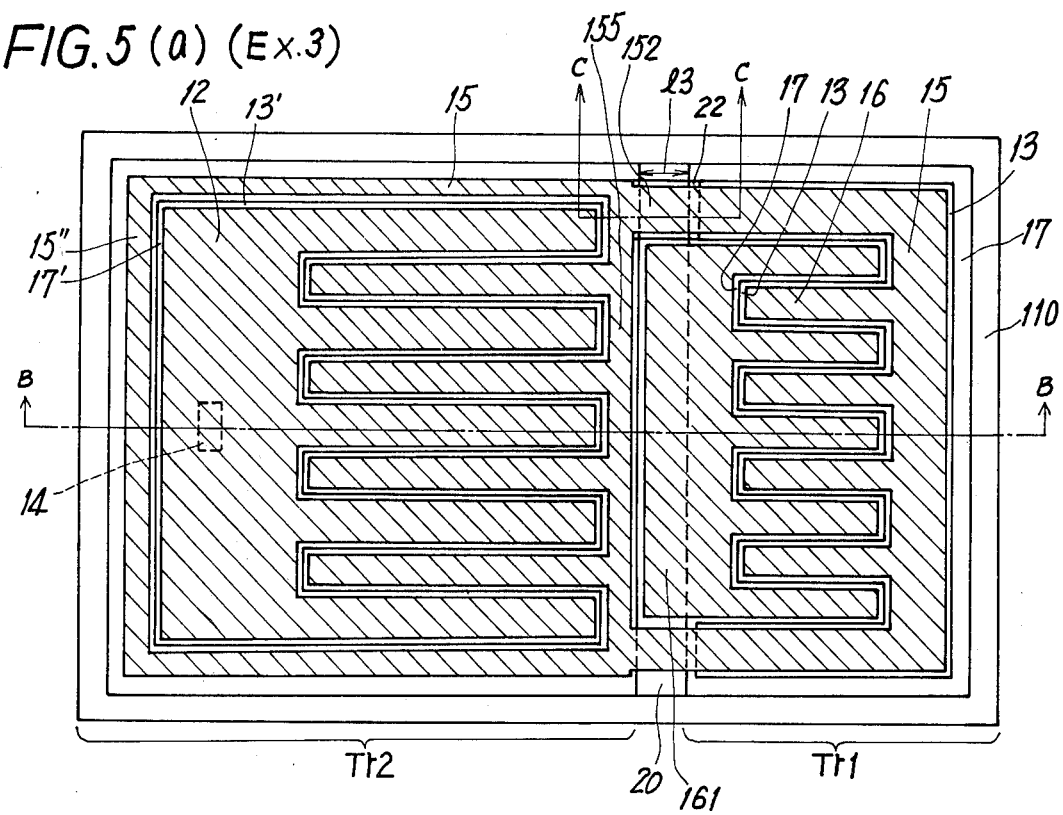
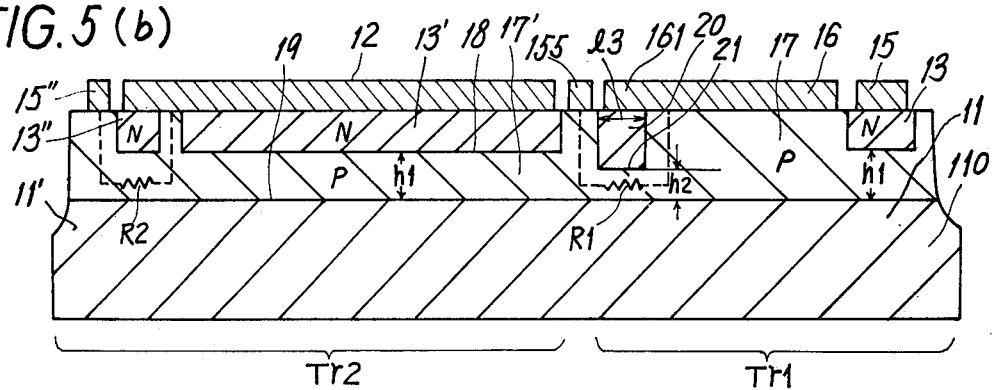
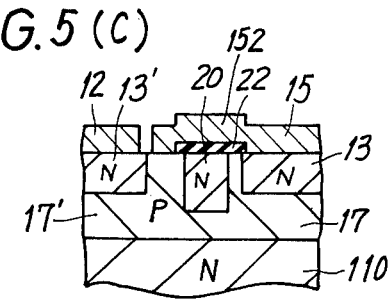
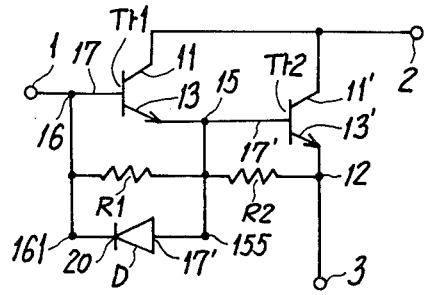
FIG.5(a) (Ex.3)
FIG.5(b)
FIG.5(c)
FIG.6 (Ex.3)

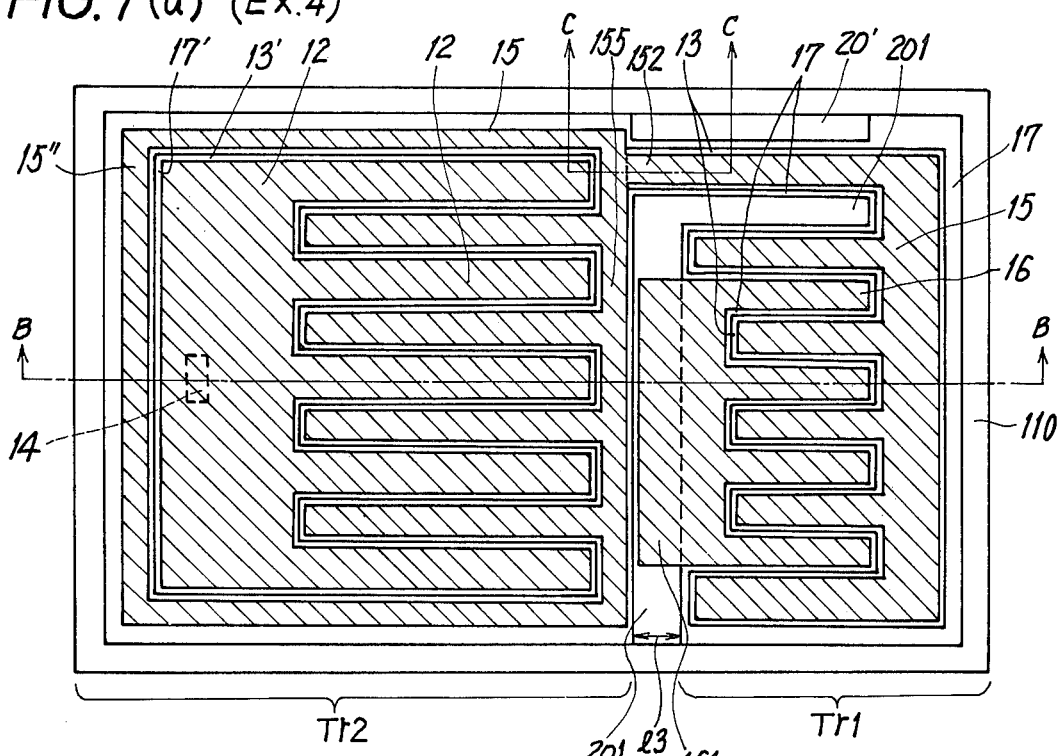
FIG.7(a) (Ex.4)
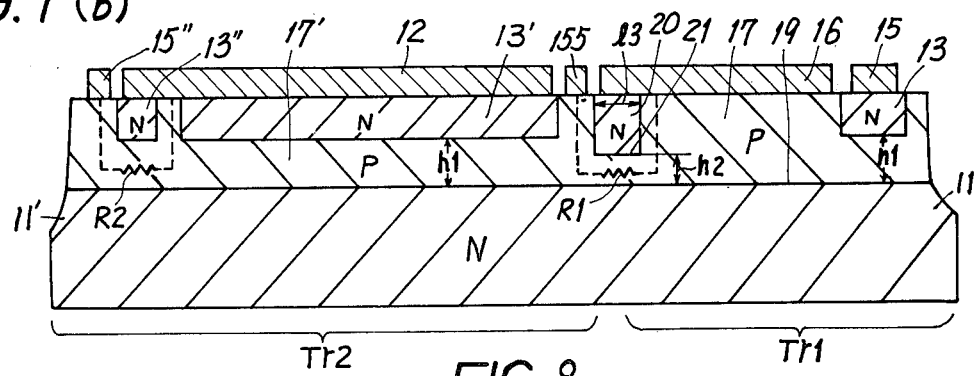
FIG.7(b)
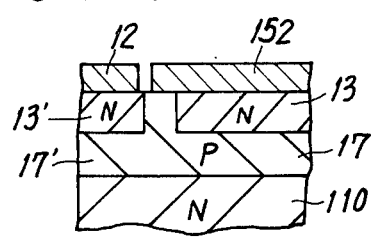
FIG.7(c)
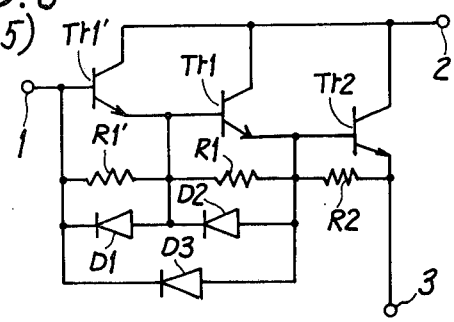
FIG.8 (Ex.5)

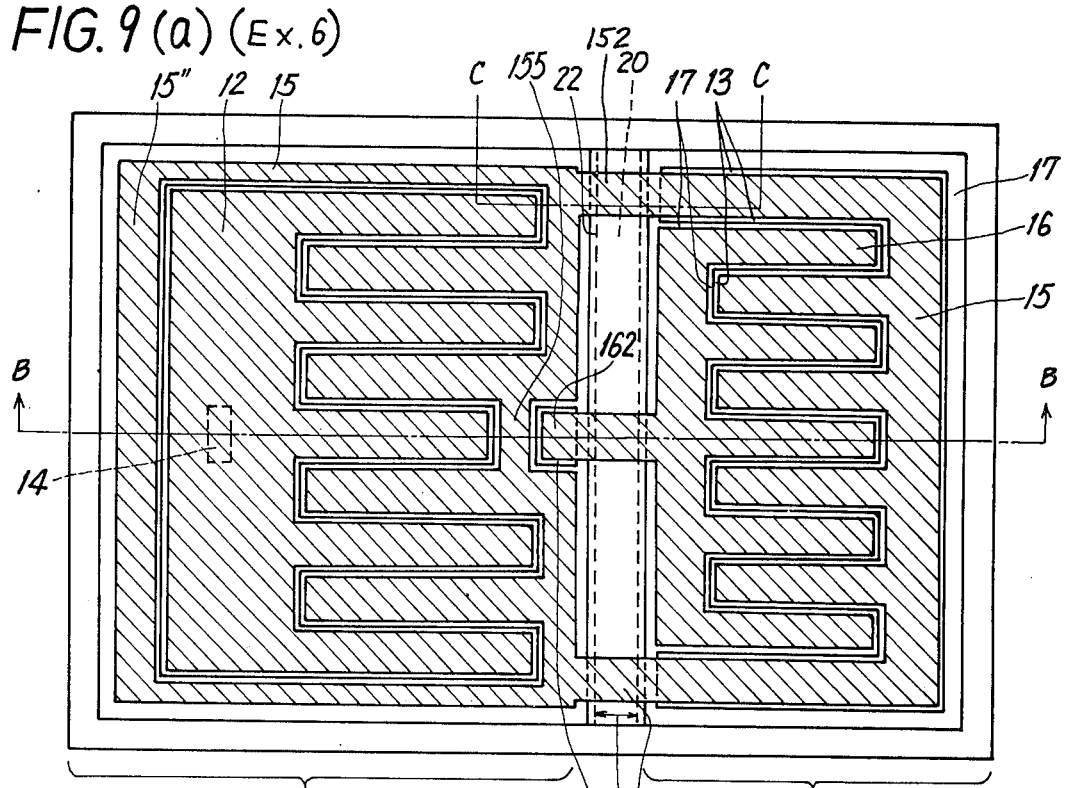
FIG. 9(a) (Ex.6)
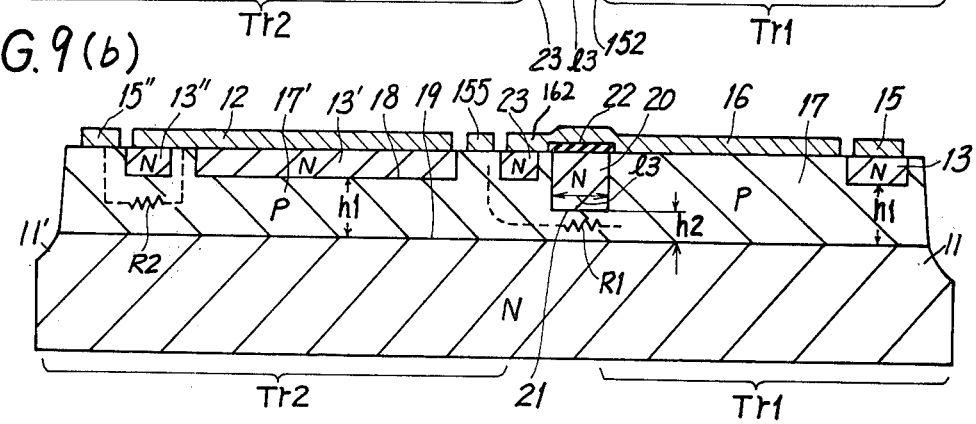
FIG. 9(b)
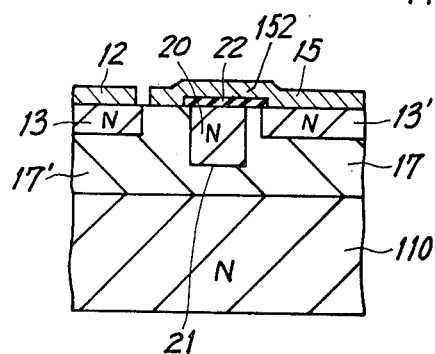
FIG. 9(c)

DARLINGTON TRANSISTOR

BACKGROUND OF THE INVENTION

This invention relates to an improvement in a monolithic device commonly known as "Darlington transistor" which is a device having Darlington connection of transistors formed on one monolithic substrate with their collectors connected in common.

As is well known, the Darlington circuit is the circuit capable of obtaining a high current amplification coefficient and is used in a circuit which requires a high current amplification coefficient.

Recently, so-called Darlington transistors which are composite semiconductor devices each having Darlington connected transistors formed on one monolithic substrate has been proposed, for instance by U.S. Pat. No. 3,836,995 for Carl Franklin Wheatley Jr. et al.

FIG. 1 is a circuit diagram of one example of a two-stage Darlington transistor circuit wherein numeral 1 is called base terminal, numeral 2 is called collector terminal and numeral 3 is called emitter terminal, respectively of the composite device. The device performs current amplification with great amplification coefficient when the abovementioned three terminals 1, 2 and 3 are connected regarding them as the base, the collector and the emitter of a transistor, respectively.

The Darlington transistor comprising a first transistor of smaller output, i.e., a driving transistor Tr1 and a second transistor, i.e., an output transistor Tr2 of larger output, connected by their collectors in common and by the emitter of the first transistor Tr1 to the base of the second transistor Tr2. Between the base and the emitter of the first transistor Tr1 a first resistance R1 is connected, and between the base and the emitter of the second transistor Tr2 a second resistance R2 is connected. The first resistance R1 is generally selected to be between 100Ω and 10KΩ, the second resistance R2 is generally selected to be between 30Ω and 1KΩ, and the value of the first resistance R1 should be selected to be larger than that of the second resistance R2.

FIG. 2(a) and FIG. 2(b) are plan view and sectional side view by B—B plane of FIG. 2(a) of a conventional Darlington transistor of mesa type NPN type, respectively, wherein the right part forms the first transistor Tr1 and the left part forms the second transistor Tr2. On an N-type silicon substrate 110 to become the common collector region 11–11', P-type base regions 17 and 17' are continuously formed by known epitaxial growth method. In the base regions 17 and 17', emitter regions 13 and 13' for the first and the second transistors Tr1 and Tr2 are formed, respectively, by known diffusion. In the second transistor Tr2 a small window part 14 is excluded from the diffusion to form the emitter region 13' so as to be retained as a part of the base region 17'. The base and emitter electrodes of both transistors Tr1 and Tr2 are formed by vapor deposition of aluminum.

The emitter electrode 12 of the second transistor Tr2 is formed to have a pattern smaller than that of the emitter region 13' and over the non-diffusion window part 14. An end part 13'' of the emitter region 13' forms an obstruction region. Through the non-diffusion window part 14 and a narrowed path under the obstruction region 13'' of length l2, the emitter electrode 12 and the base electrode 15'' of the second transistor Tr2 are connected to each other. The narrowed path in the base region 17' and under an obstruction region 13'' forms the second resistance R2, the value of which is determined by the area of the non-diffusion part 14, the length l2 of the obstruction region 13'', with W2 of the obstruction region 13'' and heights h2 of the narrowed path in the base region.

In the first transistor Tr1, the base electrode 16 is formed in an opening in the emitter electrode 15, and the emitter electrode 15 is formed in a manner that at least an extended part 15' of it contacts the base region 17' of the second transistor Tr2. The part 15' functions partly as the emitter electrode of the first transistor Tr1 and at the sametime as the base electrode of the second transistor Tr2. The emitter region 13 of the first transistor Tr1 is formed to have a pattern having an obstruction part 131 of length l1 between the base region 17 of the first transistor Tr1 and the base region 17' of the second transistor Tr2. A second narrowed path is formed between the base electrode 16 and the extended part of the emitter electrode 15' of the first transistor Tr1. The second narrowed path forms the first resistance R1, the value of which is determined by the heights h1, the length l1 and the width W1 of the narrowed path.

As is described in the above, the values of the first resistance R1 and the second resistance R2 are dependent on the lengths l1 and l2 of the obstruction regions 131 and 13'' and the heights h1 and h2 of the narrowed paths of the first and the second transistors, respectively.

In order to obtain a high current amplification coefficient, the values of the resistances R1 and R2 should be as large as possible. However, for excessively large resistance values of R1 and R2, the stability of the operation is decreased. In the structure of FIG. 2, it is easy to obtain the resistance R2 of 30Ω to 500Ω, but to obtain a high value of the resistance R1 which should have sufficiently large resistance value in comparison with that of R2 is not easy. If the length l1 of the obstruction region is made large in order to attain a large resistance value of R1, then the total size of the Darlington transistor becomes large, or in case the total size of the transistor is limited the size of either or both transistors Tr1 or Tr2 must be made small. If the height h1 of the narrowed path is made small in order to attain a large resistance value of R1, since the obstruction region 131 and the emitter regions 13 and 13' of the transistors Tr1 and Tr2 are formed in the same diffusing step, the gaps between the collector-base junction 19 and the base emitter junctions 18, 18' become small. Accordingly the characteristics of both transistors changes, for instance to lower energy breakdown levels. Therefore, decreasing of the height h1 should not be used for obtaining a high resistance vlaue of R1. Thus, in the conventional Darlington transistors, the necessary high resistance values of R1 have been obtained by using a considerably large size wafer.

There has been the following second problem in the Darlington transistor. Namely, when the Darlington transistor is used for switching use, a transient phenomenon that a reverse high electric power is consumed between the base and emitter electrodes likely to take place, the high power fades out during passing through the transistor. The shorter the fading out time is, the faster the switching speed of the switching device is. Therefore it is desirable to make the fading out time as short as possible. However, in the Darlington transistor of FIG. 1 formed in one monolithic circuit, it is difficult to make the fading out time short because of the following reason. As shown in FIG. 1, in the Darlington circuit, two junctions, namely the base-emitter junction of the first transistor Tr1 and the base-emitter junction of the second transistor Tr2 are connected in series to each other between the base terminal 1 and the emitter terminal 3. Therefore, reverse break down voltage across the base terminal 1 and the emitter terminal 3 of the composite Darlington transistor becomes twice that of a simple bipolar transistor. Therefore, in order to switch the Darlington transistor, a twice high reverse power than the simple transistor is necessary. Since the twice high reverse power is used, the fading-out of the reverse power requires a longer time than that for the simple bipolar transistor. In order to increase the switching speed of the transistor, it is necessary to make the Darlington transistor rapidly consume the reverse high power. In some examples of the present invention, a high speed of the switching is attained by providing the Darlington transistor with a means to efficiently consume the reverse high power.

SUMMARY OF THE PRESENT INVENTION

The present invention purports to provide an improved Darlington transistor formed in one monolithic substrate, having in a base region and at the position between the emitters of two transistors of the Darlington circuit a deeper diffused region than the emitter regions to form a desirable bias resistance for attaining good characteristic.

BRIEF EXPLANATION OF THE DRAWING

FIG. 3(a) is a plan view of a first example of silicon mesa type NPN Darlington transistor, FIG. 3(b) is a sectional side view at the sectional plane B—B of FIG. 3(a), FIG. 4(a) is a plan view of a second example of silicon mesa type NPN Darlington transistor, FIG. 4(b) is a sectional side view at the sectional plane B—B of FIG. 4(a), FIG. 5(a) is a plan view of a third example of silicon mesa type NPN Darlington transistor, FIG. 5(b) is a sectional side view at the sectional plane B—B of FIG. 5(a), FIG. 5(c) is a sectional side view at the sectional plane C—C of FIG. 5(a), FIG. 6 is a circuit diagram of the device shown by FIG. 5, (a) to (c), FIG. 7(a) is a plan view of a fourth example of silicon mesa type NPN Darlington transistor, FIG. 7(b) is a sectional side view at the sectional plane B—B of FIG. 7(a), FIG. 7(c) is a sectional side view at the sectional plane C—C of FIG. 7(a), FIG. 8 is a circuit diagram of a fifth example, FIG. 9(a) is a plan view of a sixth example of silicon mesa type NPN Darlington transistor, FIG. 9(b) is a sectional side view at the sectional plane B—B of FIG. 9(a) and FIG. 9(c) is a sectional side view at the sectional plane C—C of FIG. 9(a).

DETAILED DISCLOSURE OF THE INVENTION

Figure 1:
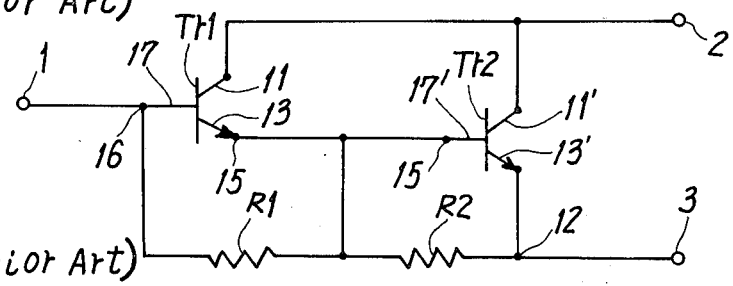
FIG. 1 is a circuit diagram of a Darlington transistor.

The present invention is described in detail referring to the examples shown in the drawing.

In FIGS. 3, (a) and (b) showing first example, which has the same circuit configuration with that of FIG. 1 and is of silicon mesa type NPN Darlington transistor according to the present invention, on the substrate 110 to become the common collector regions 11 and 11', P type base regions 17 & 17' are continuously formed by known epitaxial growth method. In the base regions 17 and 17', emitter regions 13 and 13' for the first and the second transistors Tr1 and Tr2 are formed, respectively, by phosphorus diffusion. A small non-diffusion window part 14 is formed in the emitter region 13' of the second transistor Tr2. The base electrodes 16 and 15'' and the emitter electrodes 15 and 12 of both transistors Tr1 and Tr2 are formed by vapour deposition of metal e.g. aluminum.

In the second transistor Tr2, the emitter region 13' is formed to have a pattern slightly broader than that of the electrode 12, and the emitter electrode 12 covers the non-diffusion window part 14. An end part 13'' of the emitter region 13' forms a obstruction region against current. Through the non-diffusion window part 14 and a narrowed path under the obstruction region 13'' of length l2, the emitter electrode 12 and the base electrode 15 of the second transistor Tr2 are connected to each other. The narrowed path in the base region 17' forms a second bias resistance R2 connected between the base and the emitter of the second transistor Tr2. The resistance value of the second bias resistor R2 is determined by the area of the non-diffusion window parts 14, the length l2 of the obstruction region 13'', width W2 of the obstruction region 13'', and heights h1 of the narrowed parts in the base region.

Figure 2A:
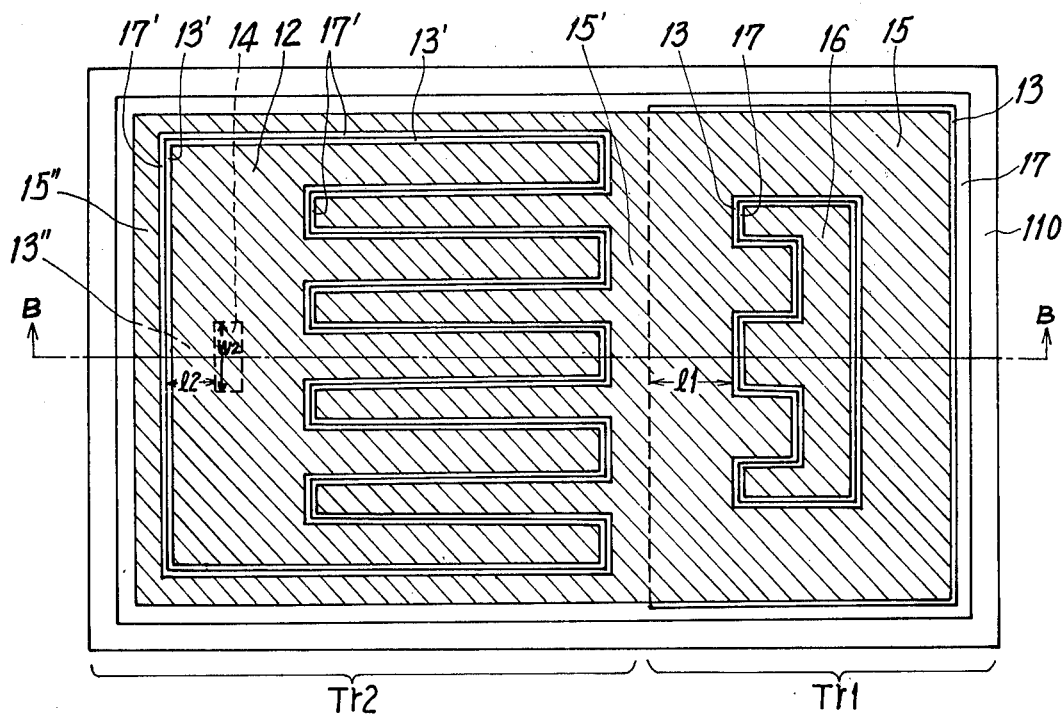
FIG. 2(a) is a plan view of a conventional silicon mesa type NPN Darlington transistor.
Figure 2B:
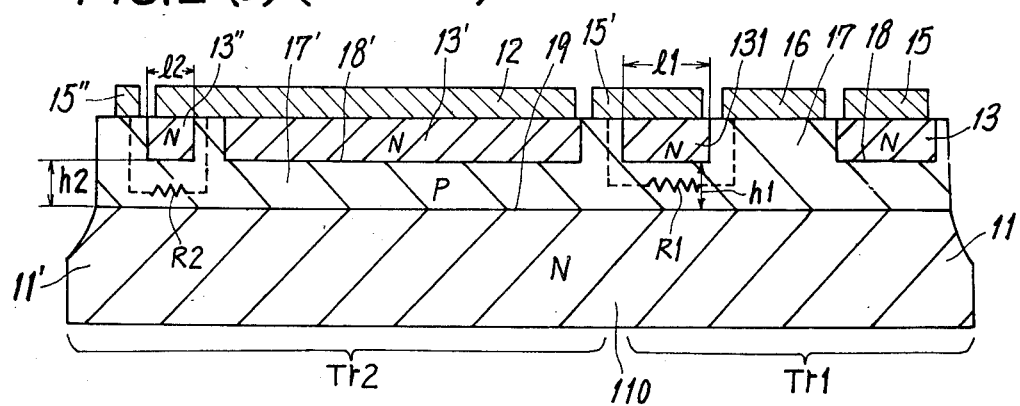
FIG. 2(b) is a sectional side view at the sectional plane B—B of FIG. 2(a)

In the first transistor Tr1, the base electrode 16 is formed in an opening in the emitter electrode 15, and the emitter electrode 15 is formed in a manner that at least an extended part 15' of it contacts the base region 17' of the second transistor Tr2. The extended part 15' functions as the emitter electrode of the first transistor Tr1 and at the same time as the base electrode of the second transistor Tr2. The emitter region 13 of the first transistor Tr1 is formed to have a pattern having an obstruction part 131 of length l1 between the base region 17 of the first transistor Tr1 and the base region 17' of the second transistor Tr2. Besides the obstruction part 131, an additional obstruction region 20 is formed by diffusion in a manner to have larger depth than that of the obstruction part 131. Namely, the diffusion front of the additonal obstruction region 20 lies deeper than those of the obstruction part 131 and the emitter regions 13 and 13'. Accordingly, the height h1 of the narrowed path formed between the diffusion front of the additonal obstruction region 20 and the collector-base P-N junction 19 can be made sufficiently small, thereby enabling to attain a sufficiently larger resistance RB in this narrowed path part under the additional obstruction region 20 in comparison with the resistance RA formed under the shallower obstruction part 131. The resistance R1 in the Darlington transistor of FIGS. 3(a) and (b) is given substantially as the sum of the abovementioned resistances RA and RB, which are dependent on the length l1 and l3 as well as heights h1 and h2, respectively. Since the depth of the diffusion front of the additional obstruction region 20 is deeper than that of the obstruction part 131, the height h2 can be made sufficiently smaller than that of h1. Accordingly, the resistance RB can be made sufficiently larger than that of the resistance RA, and therefore, a desirable value of the resistance R1 is obtainable by controlling the depth of the diffusion front of the additonal obstruction region 20. Thus, by suitably controlling the height h2, a desirable large resistance of R1 is obtainable with a sufficiently shorter total length of l1 + l4 + l3, i.e., the sum of lengths of the obstruction part 131, the inbetween gap part 139 and the additional obstruction region 20, than the length l1 of the obstruction part 131 of the prior art of FIGS. 2, (a) and (b). Accordingly, it is possible to decrease the size of the substrate.

In manufacturing process of the example of FIGS. 3, (a) and (b), the forming of the additional obstruction region 20 is done as a separate step from the step of forming the obstruction part 131 and the emitters 13 & 13'. Therefore, the height h2 can be selected freely from the height h1. Namely, a desirable value of the resistance R1 can be obtainable without influencing the component transistors to make undesirable changes in their characteristics.

Since there is no need of connecting an electrode or interconnection wire to the surface part of the additional obstruction region 20, the surface part is covered by an insulation film 22, for instance an $SiO_2$ film. By completely covering the surface of the additional obstruction region 20 and the surface of the inbetween gap part 139 with the insulation film 22, the subsequent steps of forming electrodes can be made identical with those of manufacturing of the conventional Darlington device of FIGS. 2, (a) and (b). In case the length l4 of the inbetween gap part 139 can be made sufficiently small, then the insulation film 22 on the additional obstruction region 20 is not necessary, but such condition to minimize the length l4 of the gap part 139 is very difficult to realize in a mass-production line. Accordingly, in actually mass-produced Darlington transistors, the insulation film 22, is preferably to be formed under the extended part of the emitter electrode 15'.

In case electrode film such as nickel that can not adhere onto the insulation film 22 is to be used in the later step, the insulation film 22 causes to hinder the later forming of such electrode film, thereby hindering necessary connection of the emitter of the driving transistor Tr1 to other electrode, for instance to the base of the driver transistor Tr2. in order to overcome such difficulty, in the next example, namely the second example shown by FIGS. 4 (a) and (b), special patterns of the additional obstruction region 20 and of the interconnection path 152 are deviced.

In FIGS. 4, (a) and (b), which show the second example of the present invention, there is no continuously extended part 15' of the emitter electrode as of first example of FIGS. 3, (a) and (b), which covers such a long range from the surface of the obstruction part 131 to an adjacent end part of the base region 17' of the second transistor Tr2, and instead, two metal electrodes 156 and 155 are separately formed on the obstruction part 131 and on the adjacent end part of the base region 17', in a manner not forming electrode on the surface of additional obstruction region 201. The additional obstruction region 201 is formed in a L-shaped pattern, so as to encircle the part of either, e.g., the first transistor Tr1 together with an auxiliary obstruction region 20' disposed at the fringe part of the base region 17. By means of such encircling the first transistor Tr1 with L-shaped additional obstruction region 201 and auxiliary obstruction region 20', adverse effect of decreasing the resistance R1 between the bases of the first transistor Tr1 and the second transistor Tr2 due to the existence of a considerable gap part 139 of the base region 17 between the obstruction part 131 and the additional obstruction region 201 is effectively minimized. The emitter region 13 of the first transistor Tr1 is extended to the adjacent end part of the base region 17' of the second transistor Tr2, and the emitter electrode 15 of the first transistor Tr1 is extended forming the interconnection path 152 along and on the surface of the abovementioned extended part of the emitter region 13 and further extended and connected to the electrodes 155, 15 and 15" which encircle the second transistor Tr2. The extended part of the emitter region 13 under the interconnection path 152 is formed by diffusion simultaneously with the step of forming the emitter regions 13 and 13'.

In the second example of FIGS. 4, (a) and (b), the interconnection path 152 for connecting the emitter region 13 of the first transistor Tr1 and the base region 17' of the second transistor Tr2 is made long, and disposed in a manner to pass through a channel like part formed between the obstruction region 201 and the auxiliary obstruction region 20'. Therefore the additional and auxiliary obstruction regions 201 and 20' effectively isolate the base regions 17 of the first transistor Tr1 and the base region 17' of the second transistor Tr2 thereby enabling attainment of a high value of the resistance R1. Therefore, it is also possible to attain the condition of R1>R2 and attain a high current amplification coefficient with a small size substrate.

In manufacturing process of the Darlington transistor of this example, the additional and auxiliary obstruction regions 201 and 20' are formed by a separate diffusing step from that of forming the emitter regions 13, 131 and 13'. Therefore the height h2 can be selected freely from the height h1. Namely, a desirable value of the resistance R1 can be obtainable without influencing the component transistor to make undesirable change in their characteristics.

FIGS. 5, (a), (b) and (c) and FIG. 6 show a third example comprising a diode D connected in parallel with the resistance R1. Namely, in the Darlington transistor of FIGS. 5, (a), (b) and (c), the base electrode 16 of the first transistor Tr1 is extended to form an extended part 161 onto the surface part of the obstruction region 20 having the conductivity type (N) same with and the depth larger than that of the emitter region 13. Since the obstruction region 20 has a sufficiently deep diffusion front, the height h2 of the narrowed path defined between the diffusion from 21 and the collector-base junction 19 can be made sufficiently small. Therefore, the value of the resistance R1 formed by the narrowed path can be made sufficiently large without making the length l3 of the obstruction region 20 large, and also the condition of R1>R2 can be easily attained.

The P-type base region 17' under the electrode 155 and the N-type obstruction region 20 under the extended part 161 form a P-N junction inbetween, and therefore, a diode between the base electrode 155 of the second transistor Tr2 and the extended part 161 of the base electrode 16 of the first transistor Tr1. Thus, a diode D is formed across the bases of the first and the second transistors Tr1 and Tr2 and parallel to the resistance R1 as shown in FIG. 6.

The diode D connected in parallelism with the resistance R1 enables to quickly by-pass and extinguish the aforementioned reverse high power appearing in the transient state. Therefore, in the Darlington transistor of this example, the switching speed is dependent only on the driven transistor Tr2, and accordingly is similarly as quick as those of the ordinary simple bipolar transistors.

As shown in FIG. 5(c), the surface of the obstruction region 20 and the interconnection part 152 of the emitter electrode 15 are isolated from each other by means of the insulation film 22, for instance SiO$_2$ film, formed inbetween. The emitter electrode 13 of the first transistor Tr1 is connected to the base by the interconnection part 152 to form the Darlington circuit.

In manufacturing process of the Darlington transistor of this example, the obstruction region 20 is formed by a separate diffusing step from that of forming the emitter regions 13 and 13'. Therefore, the height h2 of the narrowed path can be selected freely from the height h1. Namely, a desirable value of the resistance R1 can be obtainable without influencing the component transistors to make undesirable changes in their characteristics.

In case electrode film such as nickel that can not adhere onto the insulation film 22 is to be used in the later step, the insulation film 22 causes to hinder the later forming of such electrode film, thereby hindering necessary connection of the emitter of driving transistor Tr1 to other electrode, for instance to the base of the driven transistor Tr2. In order to overcome such difficulty, in the next example shown by FIGS. 7, (a) and (b), special patterns of the obstruction region 201 and of the interconnection electrode part 152 are deviced.

In FIGS. 7(a), (b) and (c) which show the fourth example of the present invention, an L-shaped obstruction region 201 and an auxiliary obstruction region 20' disposed at the fringe part of the base region 17 are formed in a pattern cooperatively to encircle the part of either, e.g., the first transistor Tr1. These two regions 201 and 20' are of the same conductivity type with, but has deeper diffusion front than, the emitter regions 13 and 13'. The emitter region 13 of the first transistor Tr1 is extended to the adjacent end part of the base region 17' of the second transistor Tr2, and the emitter electrode 15 of the first transistor Tr1 is extended forming the interconnection path 152 along and on the surface of the abovementioned extended part of the emitter region 13 and further extended and connected to the electrodes 155, 15 and 15'' which encircle the second transistor Tr2. The extended part of the emitter region 13 is formed by diffusion simultaneously with step of forming the emitter regions 13 and 13'.

The base electrode 16 of the first transistor Tr1 is extended to form an extended part 161 onto the surface part of the obstruction region 20 having the conductivity type (N) same with that of the emitter region 13.

By means of the encircling the first transistor Tr1 with L-shaped additional obstruction region 201 and auxiliary obstruction region 20', base regions 17 and 17' of the first and the second transistors Tr1 and Tr2 are sufficiently isolated from each other. And the obstruction region 201 and the auxiliary obstruction region 20' have sufficiently deep diffusion front, and hence the height h2 of the narrowed path defined between the diffusion front 21 and the collector-base junction 19 can be made sufficiently small. Therefore, the value of the resistance R1 formed by the narrowed path can be made sufficiently large without making the length l3 of the obstruction region 20 large, and hence the condition of R1>R2 is easily attainable without making the substrate large.

The P-type base region 17' under the electrode 155 and the N-type obstruction region 161 form a P-N junction inbetween, and therefore, a diode is formed between the base electrode 155 of the second transistor Tr2 and the extended part 161 of the base electrode 16 of the first transistor Tr1. Thus a diode D is formed across the bases of the first and the second transistors Tr1 and Tr2, namely, in parallel with the resistance R1 similarly to the circuit of FIG. 6.

The diode D connected in parallel with the resistance R1 enables to quickly by-pass and extinguish the aforementioned reverse high power appearing in transient state. Therefore, in the Darlington transistor of this example, the switching speed is dependent only on the driven transistor Tr2, and accordingly is as quick as those of the ordinary simple bipolar transistors.

In manufacturing process of the Darlington transistor of this example, the obstruction region 201 and the auxiliary obstruction region 20' are formed by a separate diffusing step from that of forming the emitter regions 13 and 13'. Therefore, the height h2 of the narrowed path can be selected freely from the height h1 under the emitter regions 13 and 13'. Namely, a desirable value of the resistance R1 can be obtainable without influencing the component transistors to make undesirable changes in their characteristics.

FIG. 8 shows circuit configuration of a fifth example wherein a pre-stage driving transistor Tr1' is connected as a pre-stage to the driving transistor Tr1, in a manner that an additional transistor Tr1' is connected by its base to the base terminal 1, by its collector to the common connected collectors of the transistors Tr1 and Tr2 and by its emitter to the base of the driving transistor Tr1. Such three stage Darlington transistor is easily obtainable by forming, in the monolithic substrate, the pre-stage driving transistor Tr1' together with the bias resistance R1' and the diode D1, which are connected to the driving transistor Tr1 in a manner similar to the driving transistor Tr1, the bias resistance R1 and the diode D2 in relation to the subsequent stage transistor Tr2. It is recommendable further to form a third diode D3 to be connected across the bases of the pre-stage driver transistor Tr1' and the driven transistor Tr2 by means of a similar method to those of the diodes D1 and D1' for attaining a higher speed of switching.

It is easy for person skilled in the art to provide or to omit any of the diode of the circuit of FIG. 8. Also, it is easy to make a further multi-stage Darlington transistor in the similar method.

The diode connected across the base and the emitter of the component transistor Tr1' or Tr1, in the reverse direction to the base-emitter junction thereof, functions to extinguish the aforementioned transient reverse high power appearing across the base-emitter electrodes of the transistor and thereby accelerate the switching speed. No adverse influence is induced by means of these diodes.

FIGS. 9, (a), (b) and (c) show a sixth example of a Darlington transistor comprising a driving transistor Tr1 and a driven transistor Tr2 in one monolithic substrate. The substrate has, in the base region, the emitter regions 13 and 13' of the driving and the driven transistors Tr1 and Tr2 isolated from each other by an obstruction region 20. The obstruction region 20 has the same conductivity type with that of the emitter regions 13 and 13' and the diffusion front depth larger than those of the emitter regions. The substrate also comprises, in the adjacent part of the base region 17' of the driven transistor Tr2, an island region 23 of the conductivity type same with the emitter regions 13 and 13'. The island region 23 is contacting with the extended part 162 of the base electrode 16. The Darlington transistor thus constructed has a resistance R1 and a diode connected in parallel to each other and across the bases of the driving transistor Tr1 and the driven transistor Tr2. The abovementioned island region 23 is disposed simultaneously with the diffusion of the emitter regions 13 and 13'. The crossing part of the surface of the obstruction region 20 with the extended part 162 and those with the interconnection parts 152 are isolated from each other by insulation films 22, for instance SiO$_2$ film.

Since the obstruction region 20 has a sufficiently deep diffusion front, the height h2 of the narrowed path defined between the diffusion front 21 and the collector-base junction 19 can be made sufficiently small. Therefore, the value of the resistance R1 formed by the narrowed path can be made sufficiently large without making the length l3 of the obstruction region 20 large, and also the condition of R1>R2 is easily obtainable.

The P-type base region 17' under the electrode 155 and the N-type island region 23 form a P-N junction inbetween, and therefore, a diode is formed between the base electrode 155 of the second transistor Tr2 and the extended part 162 of the base electrode 16 of the first transistor Tr1. Thus, a diode is formed across the bases of the first and the second transistors Tr1 and Tr2 as shown in FIG. 6.

The diode thus formed is connected in parallel with the resistance R1 and it enables to quickly by-pass and extinguish the aforementioned reverse high power appearing at the transient state. Therefore, in the Darlington transistor in this example, the switching speed is dependent only on the driven transistor Tr2, and accordingly is similarly as quick as those of the ordinary simple bipolar transistors.

In manufacturing process of the device of this example, the obstruction region 20 is formed by a separate diffusing step from that of forming the emitter regions 13 and 13'. Therefore, the height h2 of the narrowed path can be selected freely from the height h1. Namely, a desirable value of the resistance R1 can be obtainable without influencing the component transistors to make considerable changes in their characteristic.

The way of forming a diode by means of the island region of the conductivity same with that of the emitter regions can be applicable in the three stage Darlington transistor of FIG. 8.

The present invention is applicable also for examples formed on an P-type substrate and having opposite conductivity types to the corresponding parts with the abovementioned examples.

What we claim is:

1. A semiconductor device forming a two stage amplifier comprising first and second transistors interconnected in such a way that the emitter of the first transistor is connected to the base of the second transistor, the collectors of both transistors are connected in common to a first terminal, the base of the first transistor coupled to a second terminal and through a first resistor to the emitter of the first transistor respectively, and the emitter of the second transistor coupled to a third terminal, and through a second resistor to the base of said second transistor, said semiconductor device including a monolithic substrate having a collector region of a first conductivity type and a base region of a second conductivity type, said collector region and base region forming a P-N junction therebetween, said base region having at least two emitter regions of said first conductivity type, said emitter regions being relatively disposed within said base region having a predetermined space therebetween, improved wherein:
    one of said first and second resistors is formed by an obstruction region of said first conductivity type, disposed in said space between said emitter regions and extending into said base region to a depth deeper than the depth of said emitter regions, but shallower than said collector region, thereby forming a narrowed path under said obstruction region and one of said emitter regions, said path operating as said one resistor.

2. A Darlington transistor circuit formed on one monolithic substrate comprising:
    a collector layer of a first conductivity type,
    a base layer of a second conductivity type formed on said collector layer with a P-N junction therebetween,
    a first emitter region and a second emitter region of said first conductivity type formed with a space therebetween in said base layer, thereby forming first and second bipolar transistors, respectively, on the substrate, the first and a second bipolar transistor having their base regions in said base layer,
    an obstruction region of said first conductivity type formed in said space, said obstruction region having a diffusion front deeper than said emitter regions, thereby forming a narrowed path through said base layer between said first emitter region and said second emitter region,
    an island region of said first conductivity type disposed in said base region of said second transistor and between said obstruction region and said second emitter region,
    an electrode for connecting said island region to the base region of said first transistor,
    an interconnecting path of a conductive film for connecting said emitter region of said first transistor to said base region of said second transistor and an electrode for connecting said island region to said base region of the first transistor.

3. A semiconductor device forming a two stage amplifier comprising first and second transistors interconnected in such a way that the emitter of the first transistor is connected to the base of the second transistor, the collectors of both transistors are connected in common to a first terminal, the base of the first transistor coupled to a second terminal and through a first resistor to the emitter of the first transistor respectively, and the emitter of the second transistor coupled to a third terminal, and through a second resistor to the base of said second transistor, said semiconductor device including a monolithic substrate having a collector region of a first conductivity type and a base region of a second conductivity type, said collector region and base region forming a P-N junction therebetween, said base region having at least two emitter regions of said first conductivity type, said emitter regions being relatively disposed within said base region having a predetermined space therebetween, improved wherein:
    at least one of said first and second resistors is formed of an obstruction region of said first conductivity type, disposed in said space between said emitter regions and extending into said base region to a depth deeper than the depth of said emitter region, but shallower than said collector region thereby isolating said emitter regions and forming a narrowed path under said base region and one of said emitter regions, and said device includes a conductive film for effecting said connection between said first transistor emitter and second transistor base, and an insulative film, disposed to isolate said conductive film from said obstruction region.

4. A semiconductor device forming a two stage amplifier comprising first and second transistors interconnected in such a way that the emitter of the first transistor is connected to the base of the second transistor, the collectors of both transistors are connected in common to a first terminal, the base of the first transistor coupled to a second terminal and through a first resistor to the emitter of the first transistor respectively, and the emitter of the second transistor coupled to a third terminal, and through a second resistor to the base of said second transistor, said semiconductor device including a monolithic substrate having a collector region of a first conductivity type and a base region of a second conductivity type, said collector region and base region forming a P-N junction therebetween, said base region having at least two emitter regions of said first conductivity type, said emitter regions being relatively disposed within said base region having a predetermined space therebetween, improved wherein:
   one of said first and second resistors is formed by an obstruction region of said first conductivity type, disposed in said space between said emitter regions and extending into said base region to a depth deeper than the depth of said emitter regions, but shallower than said collector region thereby forming a narrowed path under said obstruction region and one of said emitter regions, said path operating as said one resistor, and wherein further;
   said obstruction region has a pattern to encircle one of said transistors and said obstruction region has a pattern with a break part, through which an interconnecting path of conductive film formed on the principal surface of the substrate connects the emitter of the first transistor and the base of the second transistor.

5. A semiconductor device forming a two stage amplifier comprising first and second transistors interconnected in such a way that the emitter of the first transistor is connected to the base of the second transistor, the collectors of both transistors are connected in common to a first terminal, the base of the first transistor coupled to a second terminal and through a first resistor to the emitter of the first transistor respectively, and the emitter of the second transistor coupled to a third terminal, and through a second resistor to the base of said second transistor, said semiconductor device including a monolithic substrate having a collector device including a monolithic substrate having a collector region of a first conductivity type and a base region of a second conductivity type, said collector region and base region forming a P-N junction therebetween, said base region having at least two emitter regions of said first conductivity type, said emitter regions being relatively disposed within said base region having a predetermined space therebetween, improved wherein:
   one of said first and second resistors is formed by an obstruction region of said first conductivity type, disposed in said space between said emitter regions and extending into said base region to a depth deeper than the depth of said emitter regions, but shallower than said collector region thereby forming a narrowed path under said obstruction region and one of said emitter regions, said path operating as said one resistor, and wherein said device further comprises:
   at least on one part of the surface of said obstruction region, an electrode connected to said base of the first transistor.

* * * * *